(12) United States Patent
Mandelman et al.

(10) Patent No.: US 6,613,615 B2
(45) Date of Patent: Sep. 2, 2003

(54) PAIR OF FETS INCLUDING A SHARED SOI BODY CONTACT AND THE METHOD OF FORMING THE FETS

(75) Inventors: Jack A. Mandelman, Stormville, NY (US); Fariborz Assaderaghi, Mahopac, NY (US); Michael J. Hargrove, Clinton Corners, NY (US); Peter Smeys, White Plains, NY (US); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/976,728
(22) Filed: Oct. 12, 2001
(65) Prior Publication Data
US 2002/0020877 A1 Feb. 21, 2002

Related U.S. Application Data

(62) Division of application No. 09/460,885, filed on Dec. 14, 1999.
(51) Int. Cl.[7] .............................................. H01L 21/00
(52) U.S. Cl. ..................... 438/154; 438/153; 438/155; 438/239; 438/241
(58) Field of Search ................................. 438/239, 241, 438/149, 153, 154, 155

(56) References Cited

U.S. PATENT DOCUMENTS 5,895,239 A * 4/1999 Jeng et al.
6,312,994 B1 * 11/2001 Nakamura

* cited by examiner

*Primary Examiner*—Long Pham
(74) *Attorney, Agent, or Firm*—Jay H. Anderson

(57) ABSTRACT

A method of forming a silicon on insulator (SOI) body contact at a pair of field effect transistors (FETs), a sense amplifier including a balanced pair of such FETs and a RAM including the sense amplifiers. A pair of gates are formed on a SOI silicon surface layer. A dielectric bridge is formed between a pair of gates when sidewall spacers are formed along the gates. Source/drain (S/D) conduction regions are formed in the SOI surface layer adjacent the sidewalls at the pair of gates. The dielectric bridge blocks selectively formation of S/D conduction regions. A passivating layer is formed over the pair of gates and the dielectric bridge. Contacts are opened partially through the passivation layer. Then, a body contact is opened through the bridge to SOI surface layer and a body contact diffusion is formed. Contact openings are completed through the passivation layer at the S/D diffusions. Tungsten studs are formed in the contact openings.

9 Claims, 9 Drawing Sheets

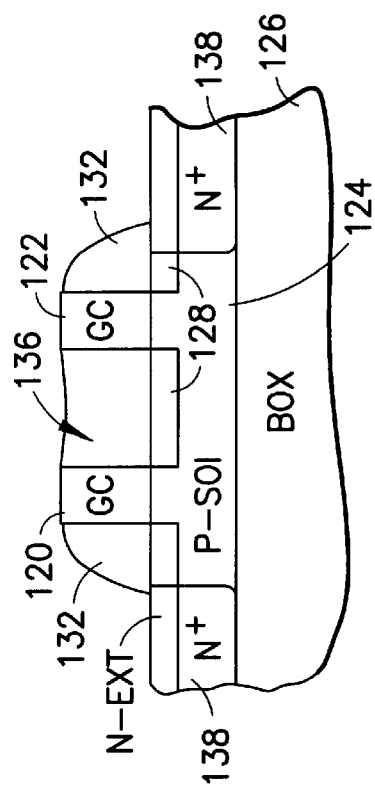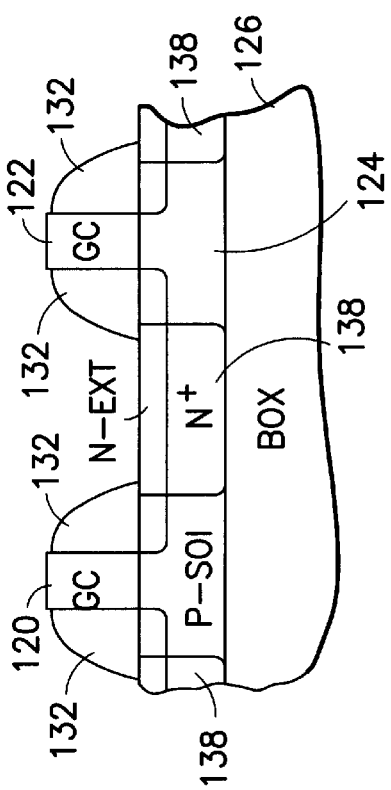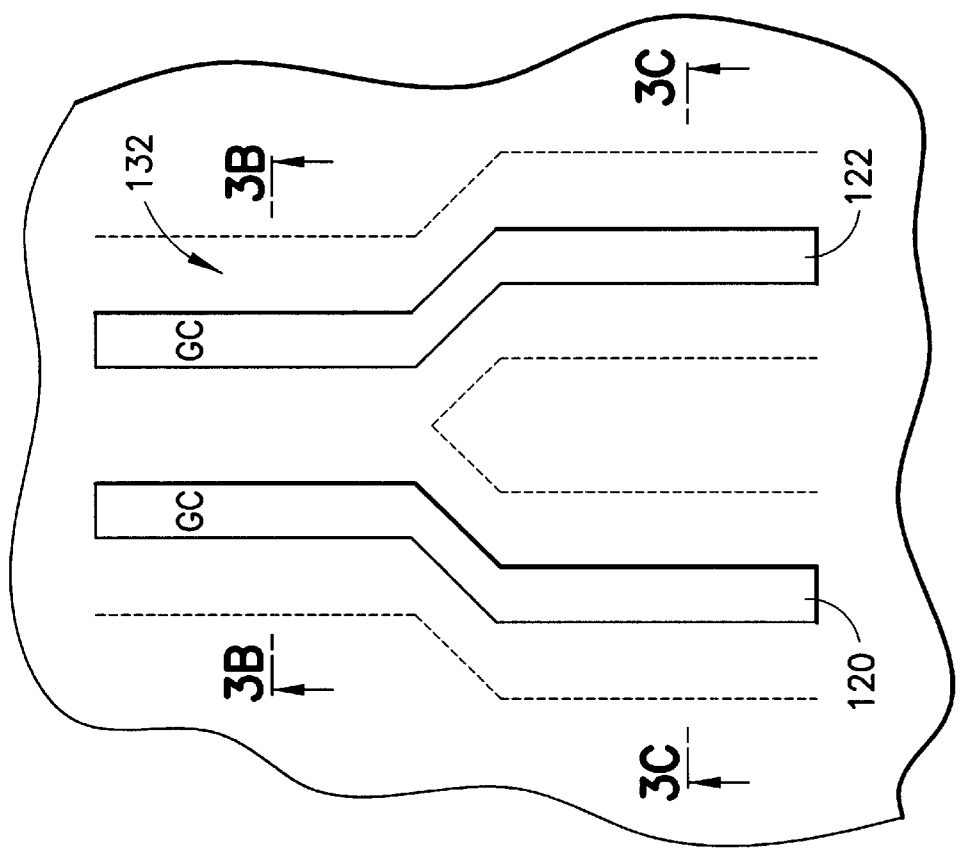

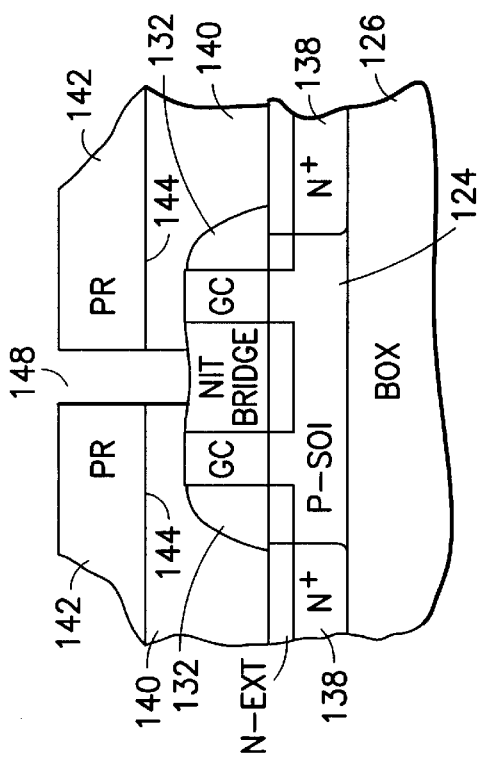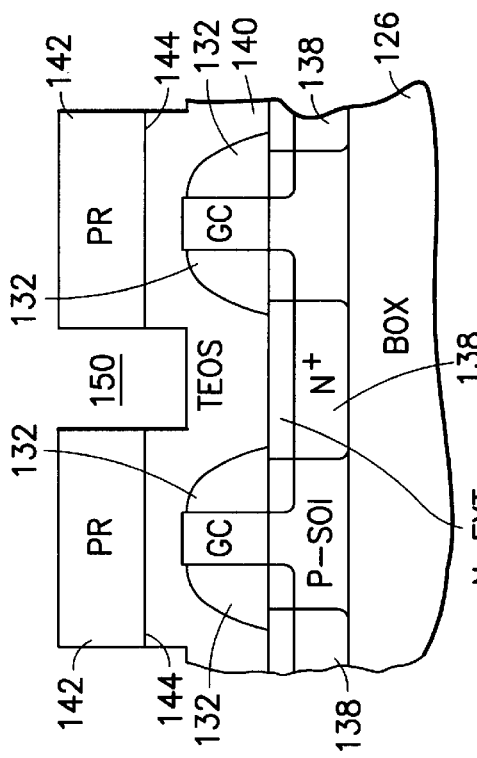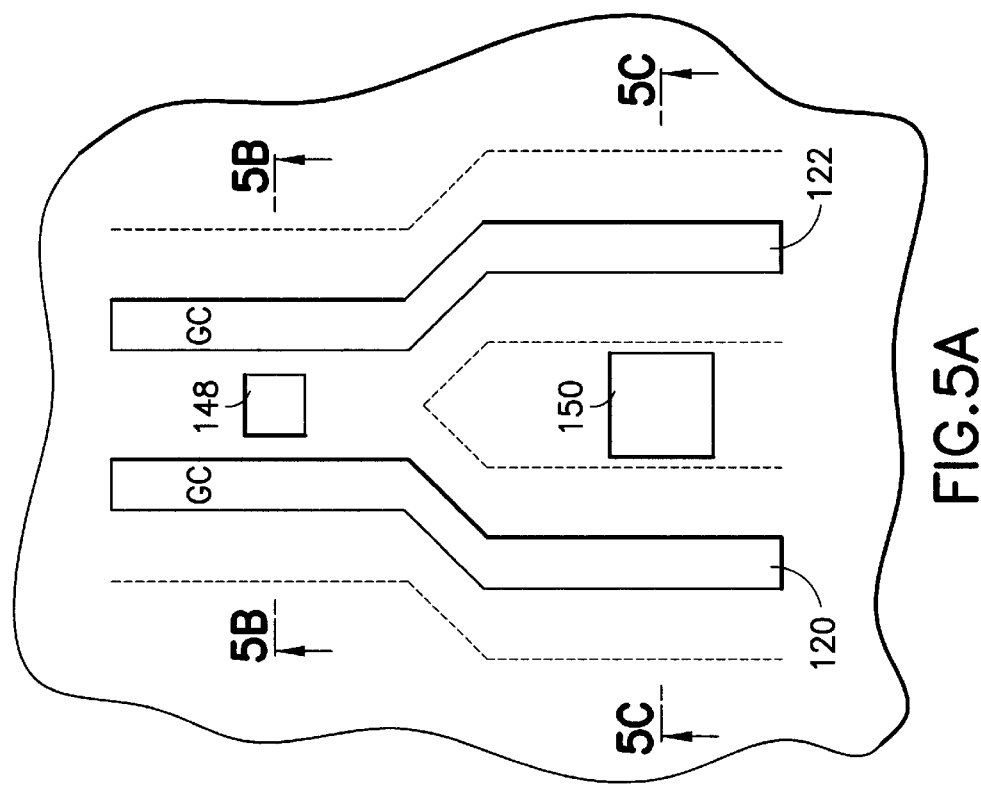

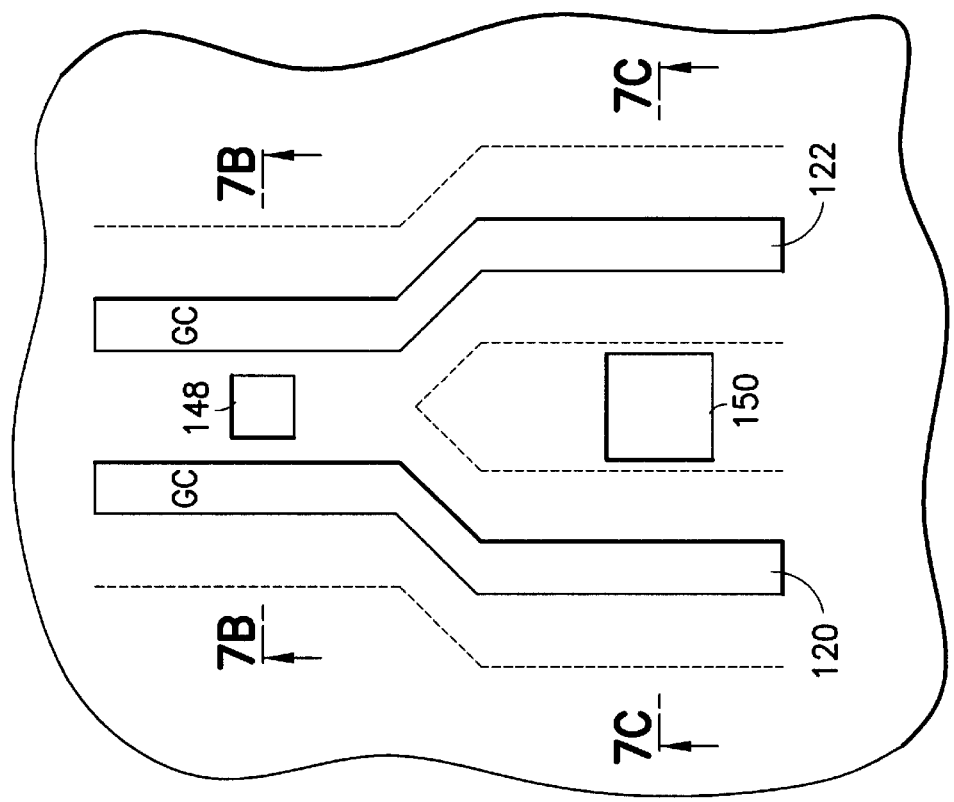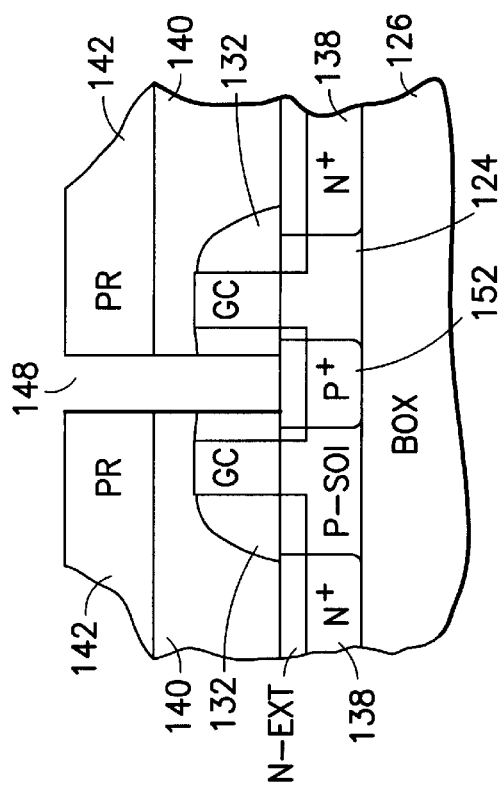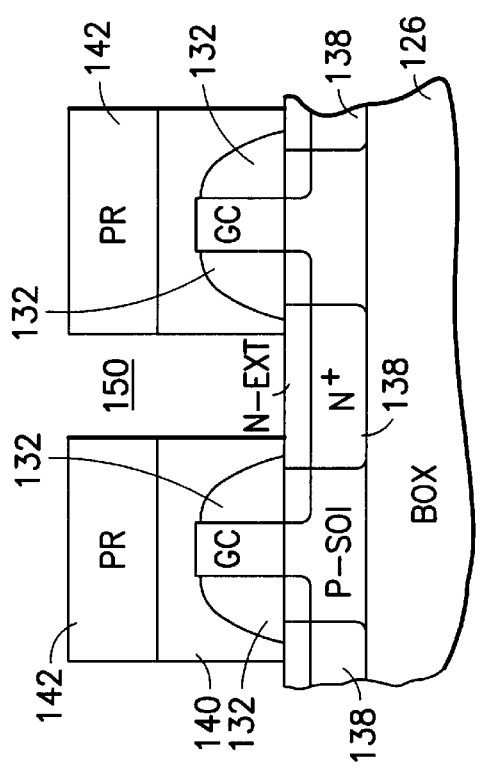
FIG. 7A
FIG. 7B
FIG. 7C

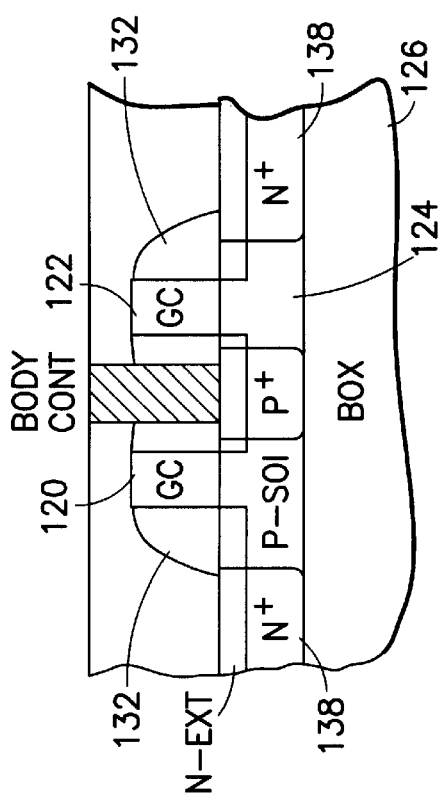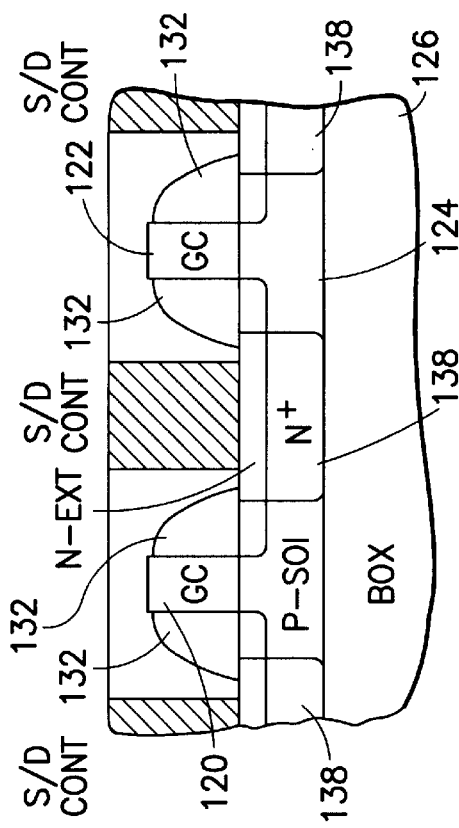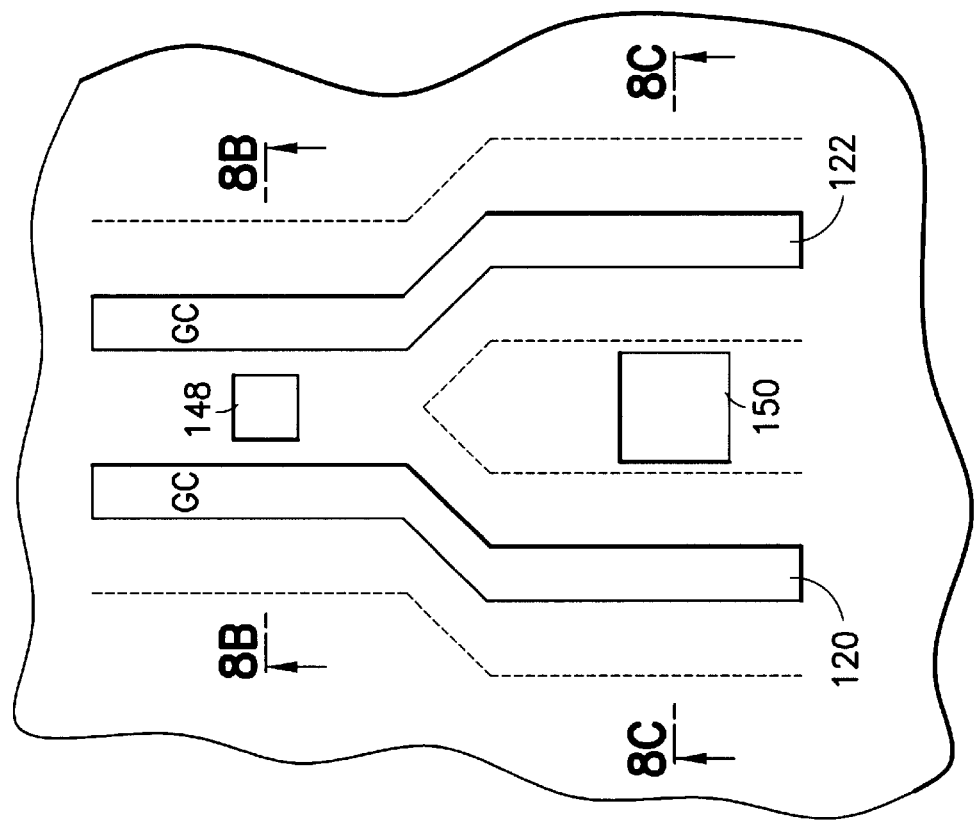

PAIR OF FETS INCLUDING A SHARED SOI BODY CONTACT AND THE METHOD OF FORMING THE FETS

CROSS REFERENCE TO RELATED PATENT APPLICATIONS

This Patent Application is a Divisional Patent Application of U.S. patent application Ser. No. 09/460,885, filed on Dec. 14, 1999.

BACKGROUND OF THE INVENTION

1. Field of the Invention

The present invention generally relates to semiconductor integrated circuits and, more particularly, to forming body contacts to a surface layer of a silicon-on-insulator integrated circuit chip.

2. Background Description

Dynamic Random Access Memory (DRAM) chips are well known. A DRAM cell is essentially a capacitor for storing charge and a pass transistor (also called a pass gate or access transistor) for transferring charge to and from the capacitor. Data (1 bit) stored in the cell is determined by the absence or presence of charge on the storage capacitor. Because cell size determines chip density, size and cost, reducing cell area is one of the DRAM designer's primary goals. Reducing cell area is done, normally, by reducing feature size to shrink the cell. Unfortunately, shrinking cell size reduces storage capacitance and, correspondingly, the charge stored in each cell.

Each cell is read by coupling the cell's storage capacitor (through the access transistor) to a bitline, which is a larger capacitance, and measuring the resulting voltage difference on the bit line. Reducing the storable charge reduces the voltage difference. Typically, the bit line signal is a few hundred millivolts (mv) that develops asymptotically from the time that the access transistor is turned on. To achieve high performance, state of the art sense amplifiers, typically a pair of cross coupled transistors, must sense a potential difference that is something less than the ultimate few hundred millivolt signal. The smaller the potential difference that the sense amplifier can sense the better. So, any difference in the transistors in the cross coupled pair increases the sensable potential difference and, therefore, slows sensing. Consequently, it is important that the transistors in the cross-coupled pair, which are normally field effect transistors (FETs), have identical device characteristics and are what is known as a balanced or matched pair.

In designing a balanced pair, great care is taken to insure that each transistor is influenced by ambient conditions identically with the other of the pair. However, other constraints may further complicate the task of designing a matched pair of transistors. For example, each sense amplifier may be constrained to fit on the same pitch as a pair of adjacent bit lines, each pair of adjacent bit lines being coupled to a corresponding sense amplifier. In this instance in addition to other constraints, the cross coupled transistor pair must fit in a very narrow pitch. This narrow pitch further complicates transistor design placement (layout) to achieve a balanced pair, especially for silicon-on-insulator circuits.

SOI transistors may be formed on the surface of a silicon layer isolated from a silicon substrate by a buried oxide (BOX) layer. In a typically complex series of mask steps, shallow trenches filled with oxide isolate SOI islands of the surface silicon layer on which circuits are formed. Local contacts are made to each of the circuit's conduction wells and at least one body contact is made to the silicon layer island. For most circuits it is sufficient to form a single body contact to a p-type silicon island layer at a common point with n-type FETs (NFETs) distributed around the island. Normally, slight variations in device characteristics such as device thresholds, are negligible, neglectable and not given much consideration for typical logic circuits such as decoders or timing logic.

However, these otherwise slight threshold variations can seriously handicap an otherwise well designed sense amplifier layout, unbalancing a matched pair. This is especially a problem for a SOI sense amplifier where asymmetric body charging can exacerbate device differences. Further, to overcome these variations by providing individual body contacts to each pair of sense amplifier FETs can increase sense amplifier area and, still may not result in a matched pair of transistors. See for example, J. A. Mandelman et al., "SOI MOSFET Mismatch Due To Floating Body Effects," Proceedings 1997 IEEE International SOI Conf., October, 1997, pp. 164–5. In addition each added mask step increase chip turnaround time, increases chip processing complexity and chip cost.

Thus, there is a need for SOI layer body contacts that can be formed at adjacent pairs of closely spaced transistors without increasing the layout area of the transistors, adding mask steps and processing complexity.

SUMMARY OF THE INVENTION

It is therefore a purpose of the present invention to improve the Dynamic Random Access Memory (DRAM) performance;

It is another purpose of the present invention to increase DRAM sense amplifier signal margin;

It is yet another purpose of the present invention to increase DRAM sense amplifier signal margin without increasing sense amplifier area;

It is yet another purpose of the present invention to increase DRAM sense amplifier signal margin without increasing the number of mask steps required to form the DRAM;

It is yet another purpose of the present invention to improve threshold matching for matched transistor pairs;

It is yet another purpose of the present invention to form matched transistor pairs;

It is yet another purpose of the invention to form individual body contacts at each pair of matched transistors without increasing the area of the matched transistor pairs.

The present invention is a method of forming a silicon on insulator (SOI) body contact at a pair of field effect transistors (FETs), a sense amplifier including a balanced pair of such FETs and a RAM including the sense amplifiers. A pair of gates are formed on a SOI silicon surface layer. A dielectric bridge is formed between a pair of gates when sidewall spacers are formed along the gates. Source/drain (S/D) conduction regions are formed in the SOI surface layer adjacent the sidewalls at the pair of gates. The dielectric bridge blocks selectively formation of S/D conduction regions. A passivation layer is formed over the pair of gates and the dielectric bridge and a contact mask is formed on the passivation layer. Contacts are opened partially through the passivation layer. Then, a body contact is opened through the bridge to SOI surface layer and a body contact diffusion is formed. Using the same contact mask, contact openings are completed through the passivation layer at the S/D diffusions. Tungsten studs are formed in the contact openings.

The balanced transistors may be cross coupled and used as a sense amplifier in a RAM.

BRIEF DESCRIPTION OF THE DRAWINGS

The foregoing and other objects, aspects and advantages will be better understood from the following detailed preferred embodiment description with reference to the drawings, in which:

FIGS. 3A–C show the step of forming sidewall spacers along the gates and dielectric bridges between the gates;

FIGS. 5A–C show the step of forming a contact pattern is etched partially into the TEOS surface to a depth sufficient to expose the upper surface of the nitride bridges;

FIGS. 7A–C show the step of completing S/D contact openings through TEOS layer;

FIGS. 8A–C show the step of simultaneously forming studs in body contacts and in S/D contacts;

DETAILED DESCRIPTION OF A PREFERRED EMBODIMENT OF THE INVENTION

Figure 1:
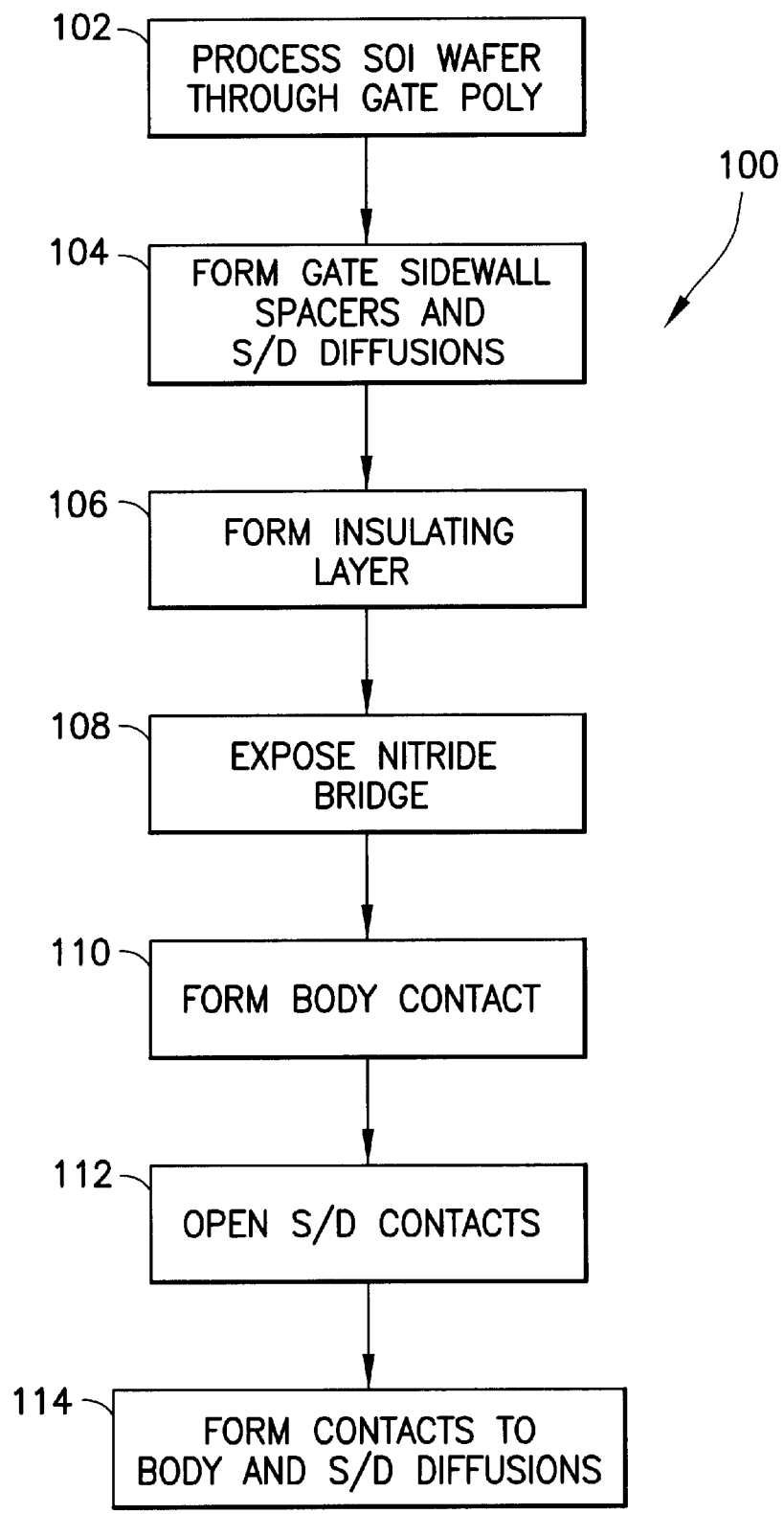
FIG. 1 shows a flow diagram of the preferred embodiment silicon-on-insulator (SOI) process for forming shared body contacts.

Referring now to the drawings, and more particularly, FIG. 1 shows a flow diagram of the preferred embodiment silicon-on-insulator (SOI) process 100 for forming shared body contacts in a pair of transistors that may be used to form a sense amplifier for a random access memory (RAM), preferably for a dynamic RAM (DRAM). First, in step 102 a SOI wafer is prepared, gates are formed on the SOI wafer and a thin extension layer is formed on a surface SOI layer. Next in step 104 sidewall spacers are formed along the sides of the gates and source/drain diffusions are formed on the surface SOI layer alongside the sidewall spacers. At points where the pairs of gates are closest to each other, the sidewall spacers merge, forming spacer bridges which prevent source/drain diffusion formation thereunder. Then, in step 106, an insulating layer is formed over wafer. Next in step 108 a contact pattern for source, drain and body contact is formed partially though the insulator layer. The contact pattern extends through the insulator layer to the spacer bridges and partially through the insulator layer at the source/drain diffusions. In step 110, body contact openings are formed through the spacer bridges and a body contact diffusion is formed in the surface SOI layer. In step 112, the source/drain contact openings are completed through the insulator layer to the source/drain diffusions. Contact studs are formed in the source, drain and body contact openings in step 114. Then, circuit formation continues normally, defining circuit elements and interconnecting circuits using normal interconnection methods.

FIGS. 2A–C through 8A–C illustrate the steps of the process 100 of forming a shared contact between a pair of SOI devices which may be balanced or mirrored SOI devices according to the steps of FIG. 1. As described herein, for each group of three figures labeled A–C, the A Figure corresponds to a plan or layout view and, the B and C Figures are cross sections corresponding to BB and CC respectively of the plan view in the A Figure. Further, unless a view is referred to specifically, each group of three figures are referred to by its corresponding numeral, e.g., FIG. 2 refers to FIGS. 2A–C.

Figure 2B:
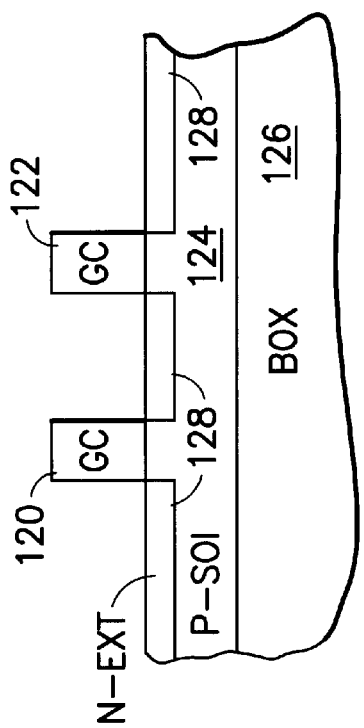
FIGS. 2A–C show the step of forming gate conductors of adjacent FETs on a surface of a SOI wafer.
Figure 2C:
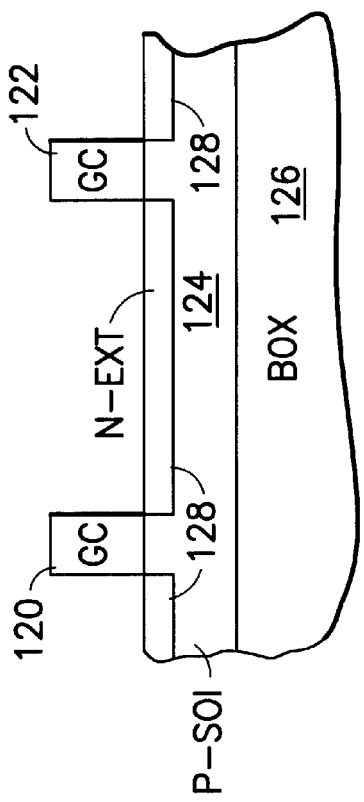
Figure 2A:
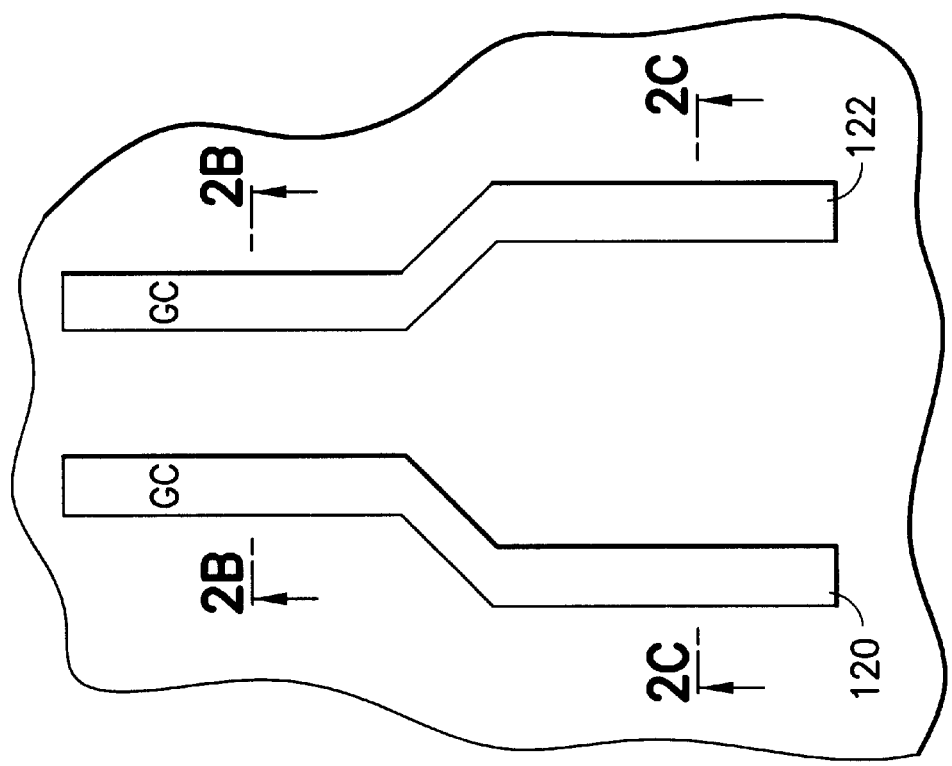

Thus, FIG. 2 show the gate conductors 120, 122 of adjacent field effect transistors (FETs) formed on a surface of a SOI wafer in step 102. Although the present invention is described herein for forming a balanced pair of n-type FETs (NFETs) with a shared body contact, it is understood that a balanced pair of p-type FETs (PFETs) with a shared body may be formed following substantially the same steps, substituting p-type dopants for n-type dopants and vice versa without departing from the spirit or scope of the invention. So, as can be seen from the cross sections of FIGS. 2B–C, the gates 120, 122 are formed on a surface silicon layer 124. Preferably, gate conductors 120, 122 are doped polysilicon, doped with n-type dopant, surface silicon layer 124 is doped with p-type dopant, threshold tailored for NFETs. Silicon layer 124 is isolated from an underlying substrate (not shown) by an insulating layer, preferably a buried oxide (BOX) layer 126. A thin source/drain (S/D) extension layer 128 is formed, preferably, implanting n-type dopant into the surface 130 of surface silicon layer 124, patterned by the gates 120, 122. A wide spacing is provided between gates 120, 122 at cross section CC ans is wide enough for the subsequent formation of S/D diffusions in those areas and contacts to the S/D diffusions.

In step 104 as shown in FIG. 3, a conformal dielectric layer is formed on the surface 130 and anisotropically etched to leave sidewall spacers 132 along the gates 120, 122 and bridging forming dielectric bridges 136 between the gates 120, 122 in area BB. The spacing between gate lines 120, 122 at cross section BB is sufficiently narrow that the gap between the gates 120, 122 is filled with spacer material when sidewall spacers material is deposited. The spacer material bridges the gates at cross sections BB forming bridges 136 and is thick enough to block the source/drain implant, thereby preventing the subsequent formation of S/D diffusions.

Preferably, the dielectric layer is a layer conformal $Si_3N_4$ and spacers are formed using a reactive ion etch (RIE), although any suitable dielectric material and method of forming spacers may be substituted. Low resistance S/D diffusions 138 are formed between the spacers 132 with, preferably, a heavy N+ implant and diffusion. The bridges 136 prevent S/D diffusion from forming in that area, automatically masking the heavily doped S/D implants. Thus, as described above, the present invention exploits the topography of the passivating layer over the gates and over sidewall spacers and the spacing between gates 120, 122.

Figure 4B:
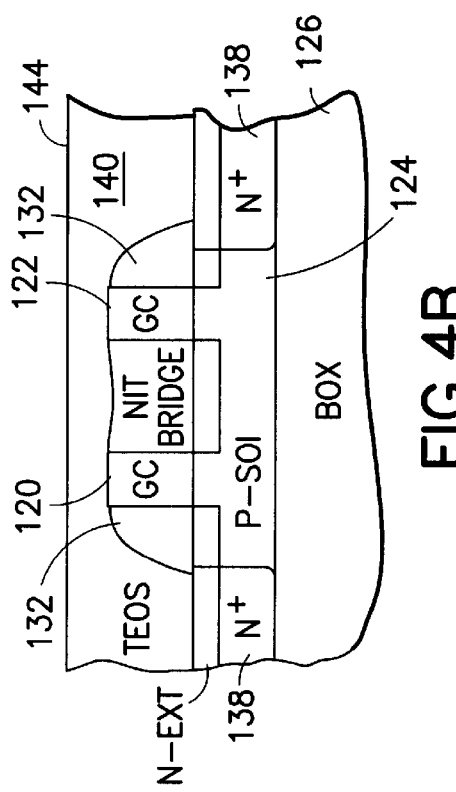
FIGS. 4A–C show the step of forming a TEOS layer on the wafer.
Figure 4C:
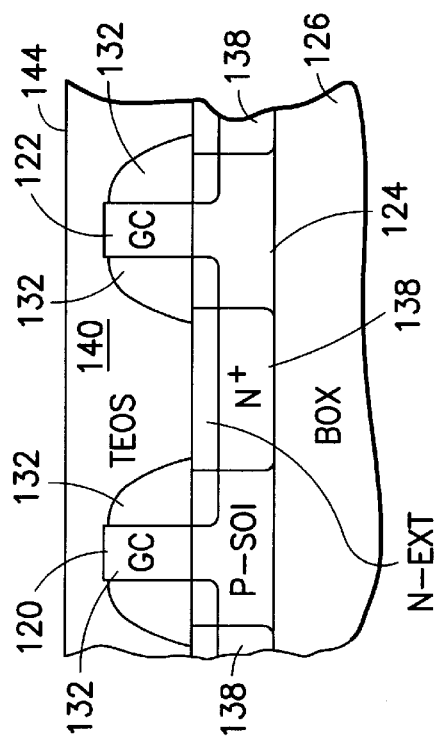
Figure 4A:
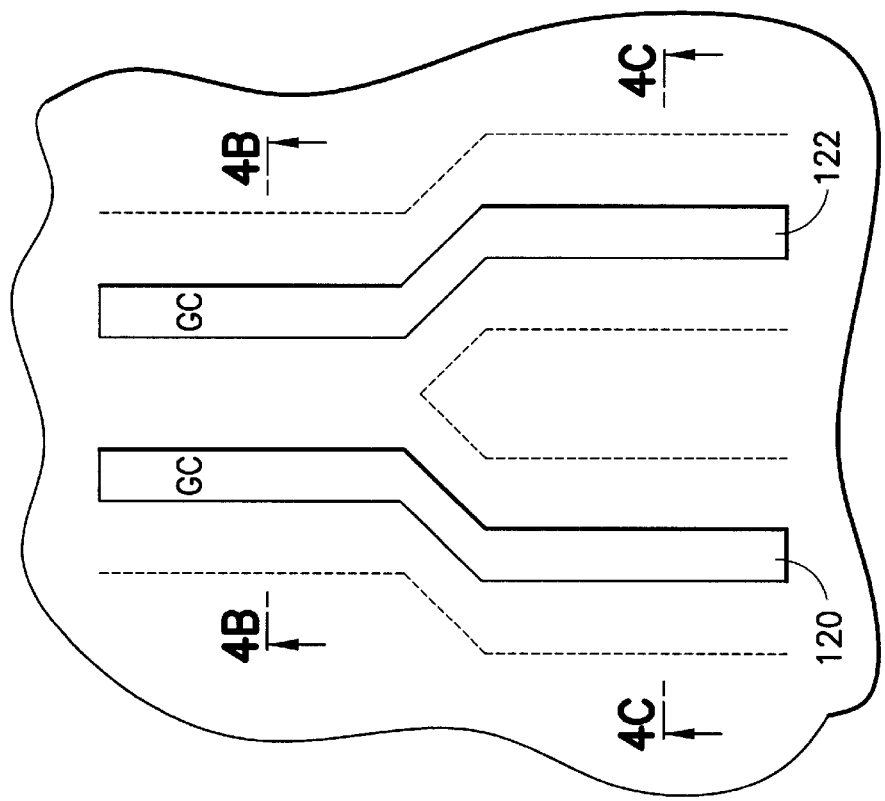

Next, in step 106 as shown in FIG. 4, a passivation layer 140, preferably formed from tetra-ethyl-oxi-silane (TEOS), or another suitable dielectric material is deposited on the surface and, preferably, planarized. Then, in step 108 as shown in FIG. 5, a layer of photoresist 142 is formed on the planarized surface 144 of the TEOS layer 140 and patterned with a contact pattern using a typical photolithographic patterning process. Then, the contact pattern is etched partially into the TEOS surface 140 to a depth sufficient to expose the upper surface 146 of nitride bridge 136 in body contact openings 148. The TEOS etch is timed such that TEOS remains in the S/D contact openings 150, thick enough to protect the S/D diffusions 138 from subsequent body-contact diffusion and formation.

Figure 6B:
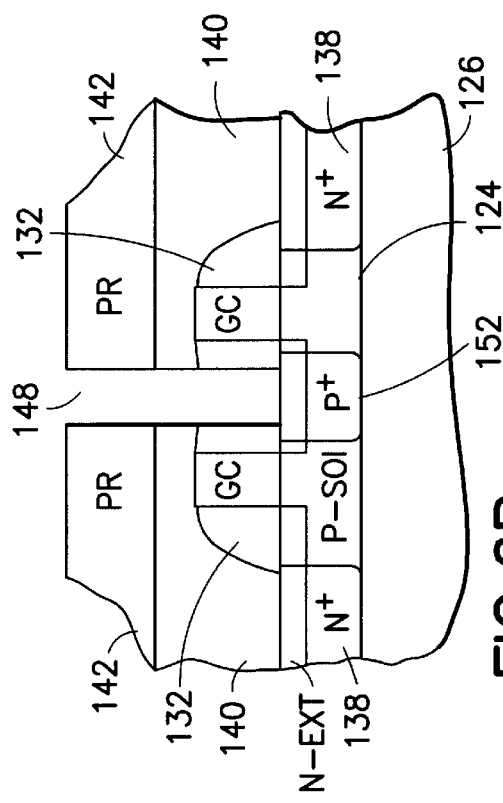
FIGS. 6A–C show the step of etching the nitride bridge to the underlying surface of the silicon surface layer.
Figure 6C:
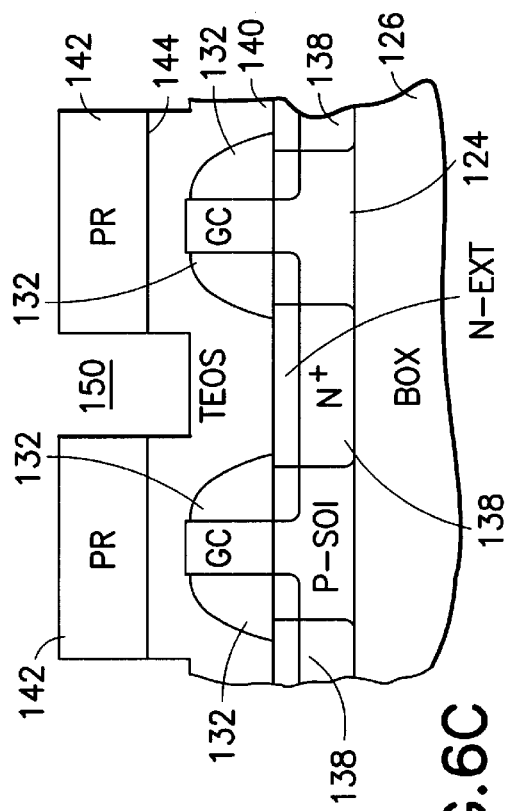
Figure 6A:
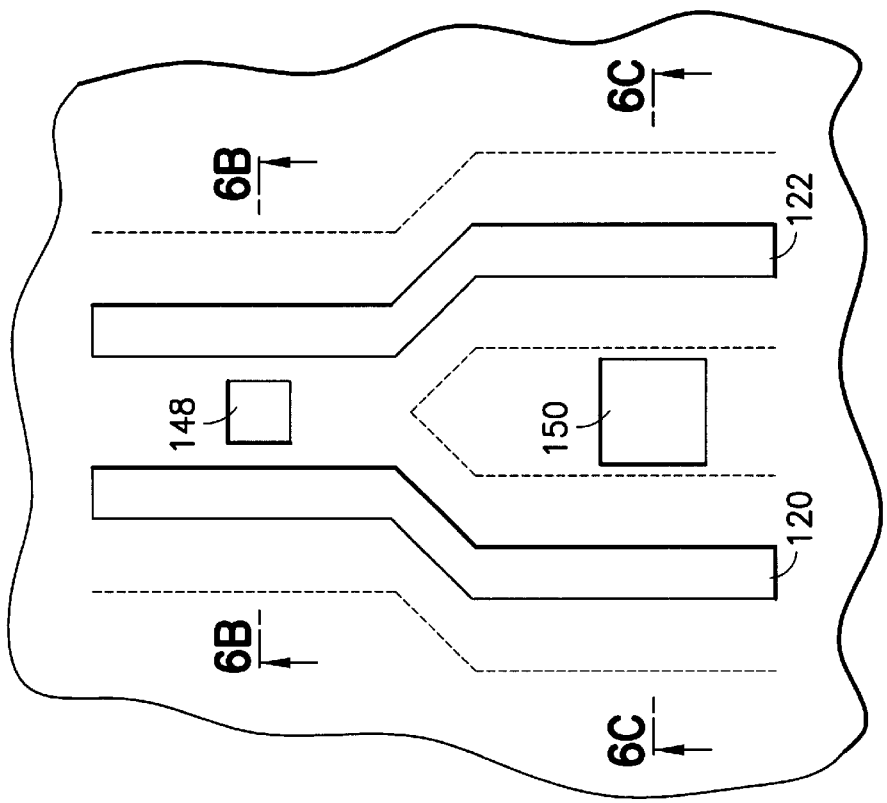

Then, in step 110 as shown in FIG. 6, the body contact opening 148 is etched through the nitride bridge 136 using a selective RIE that is selective to oxide and photoresist, to the underlying surface 130 of silicon layer 124. Any oxide that may remain on the surface 130 is removed using an etch typically containing fluorine. P-type dopant is implanted through the body contact opening 148 into the silicon surface layer 124 forming heavily doped p$^+$ diffusion 152. The selected p-type dopant concentration is sufficient to overcompensate the existing N-type extension in surface layer 128.

In step 112, having opened body contacts 148 and formed heavily doped p+ diffusions 152, S/D contact openings 150 are completed through TEOS layer 140 in FIG. 7. Preferably, the remaining TEOS layer 140 in S/D contacts 150 is etched away using a RIE that is selective to silicon and photoresist. Thus, the both the body contact openings 148 and the source/drain contact openings 150 are formed using the same mask, thereby avoiding any requirement for extra mask steps and the additional cost for additional mask steps. Then, the photoresist contact mask pattern 142, is removed and in step 114 as shown in FIG. 8, body contacts 148 and in S/D contacts 150 are simultaneously filled with conductive material, preferably, using a damascene process. Typically, the conductive material is tungsten, deposited to fill the contact openings 148, 150. Excess tungsten is removed and the surface is planarized using a chemical-mechanical polishing process to complete the tungsten studs 148, 150.

Figure 9:
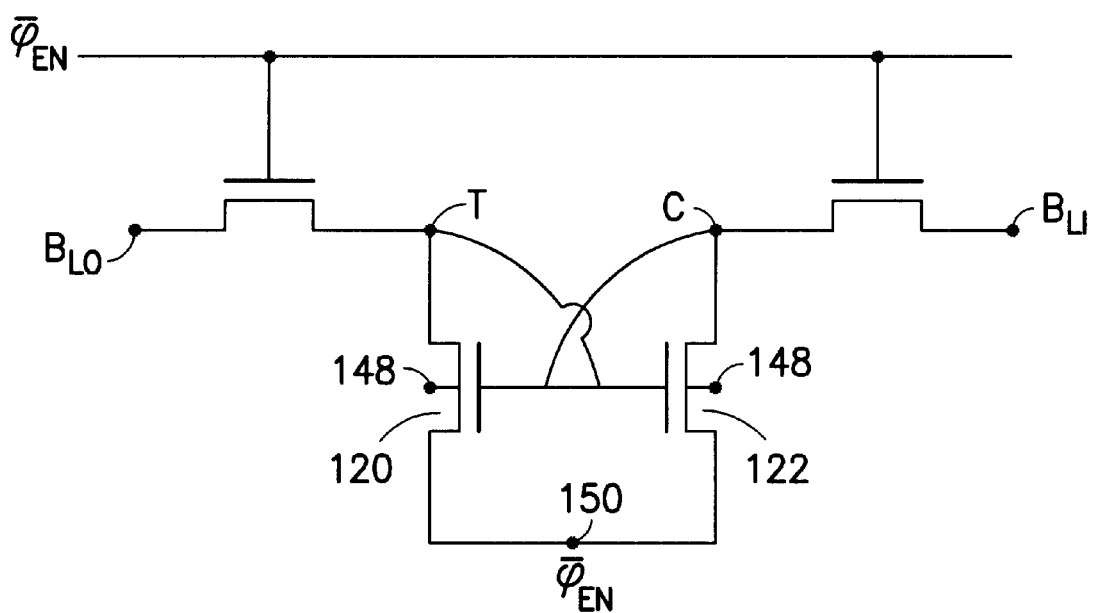
FIG. 9 shows the pair of cross coupled transistors of FIGS. 8A–C used in a RAM sense amplifier.

Having formed the S/D contacts 148 and body contacts 150, each transistor pair 120, 122 is a matched pair of transistors mirrored about a line through body contact 150 perpendicular to cross section BB. A high gain sense amp may be formed by cross coupling this transistor pair 120, 122 using typical integrated circuit chip techniques as represented schematically in FIG. 9. The body contact is placed with respect to the transistor pair 120, 122 such that localized body effects are identical at corresponding points along the channels of the pair of transistors. Further, the location of the body contact 150 is such that the transistor thresholds will be, effectively, identical.

Thus, a superior sense amplifier is formed of the cross coupled pair of transistors 120, 122. Sense amplifier signal margin is increased. Sense amplifier performance is improved and, correspondingly, performance is improved in DRAMs including the sense amplifiers. By taking advantage of what might otherwise be considered a defect, i.e., spacer bridging at appropriately spaced gates, all of this has been achieved without adding costly mask steps to form the body contact. In addition the method of forming body contacts of the present invention may be applied to forming body contacts to any pair of FETs or to individual FETs.

While the invention has been described in terms of preferred embodiments, those skilled in the art will recognize that the invention can be practiced with modification within the spirit and scope of the appended claims.

We claim:

1. A method of forming a pair of field effect transistors (FETs), said method comprising the steps of:
   a) forming a dielectric bridge between two gate conductors on a semiconductor layer, the two gate conductors being a pair of FET gates, including the steps of
      i) forming the pair of gates on a surface of the semiconductor layer, said gates being arranged such that a first portion is spaced closer together than a second portion, and
      ii) forming dielectric sidewall spacers along said gates, said sidewall spacers on one side of each of said pair of gates merging at said first portion;
   b) forming conduction regions in said semiconductor layer adjacent gate conductors, said bridge blocking formation of conduction regions between said two gate conductors immediately below said dielectric bridge;
   c) forming a passivating layer over said gate conductors and said dielectric bridge; and
   d) forming a body contact through said bridge to said semiconductor layer.

2. A method of forming a pair of FETs as in claim 1, wherein the step (i) of forming the pair of gates further comprises implanting a first type dopant into the surface of the semiconductor material.

3. A method of forming a pair of FETs as in claim 2, wherein the semiconductor material is silicon, the dielectric sidewall spaces are nitride spacers, the dopant implanted into the surface of the silicon layer forms a source/drain extension layer and the step (c) of forming the passivation layer comprises the steps of:
   i) depositing an oxide layer on said surface covering said gates and said bridge; and
   ii) planarizing said oxide layer.

4. A method of forming a pair of FETs as in claim 3, wherein the conduction regions formed in step (b) are source/drain regions, said method further comprising the step of:
   e) forming contacts to said source/drain regions.

5. A method of forming a pair of FETs as in claim 4, wherein the step (d) of forming a body contact through the bridge comprises the steps of:
   i) partially forming a contact pattern in said oxide layer, said contact pattern exposing said nitride bridge in body contact locations;
   ii) opening said body contact through said bridge to said surface of said silicon layer;
   iii) implanting a second type dopant into said silicon layer through said opened body contact, said second dopant type being blocked from source/drain regions by oxide remaining in patterned source/drain contacts; and
   iv) filling said body contacts with conductive material.

6. A method of forming a pair of FETs as in claim 5, wherein the step (e) of forming contacts to the source/drain regions comprises the steps of:
   i) opening said patterned source/drain contacts to said surface of said silicon layer, said source/drain regions being exposed in said source/drain contacts; and
   ii) filling said source/drain contacts with conductive material.

7. A method of forming a pair of FETs as in claim 6, wherein the first dopant type is n-type, the second dopant type is p-type, the conductive material is tungsten and the body contact and the source/drain contacts are filled with tungsten simultaneously.

8. A method of forming a sense amplifier having a balanced pair of FETs formed as in claim 7.

9. A method of forming a random access memory (RAM), said RAM including a plurality of amplifiers formed as in claim 8.

* * * * *